United States Patent [19]
Olsen

[11] 4,348,683
[45] Sep. 7, 1982

[54] CHART RECORDING APPARATUS

[75] Inventor: Everett O. Olsen, Wrentham, Mass.

[73] Assignee: The Foxboro Company, Foxboro, Mass.

[21] Appl. No.: 293,392

[22] Filed: Aug. 17, 1981

Related U.S. Application Data

[60] Division of Ser. No. 923,009, Jul. 10, 1978, Pat. No. 4,310,841, which is a division of Ser. No. 641,075, Dec. 15, 1975, Pat. No. 4,123,696, which is a division of Ser. No. 543,443, Jan. 23, 1975, abandoned, which is a continuation of Ser. No. 333,997, Feb. 20, 1973, abandoned.

[51] Int. Cl.³ ............................................ G01D 11/16
[52] U.S. Cl. .................................... 346/31; 346/44; 346/139 R
[58] Field of Search .................. 346/31, 32, 139 R, 44; 324/157, 125, 113; 335/285, 209; 192/21.5; 73/430; 340/870.43, 870.42; 318/623

[56] References Cited

U.S. PATENT DOCUMENTS

| | | | |
|---|---|---|---|
| 2,331,205 | 10/1943 | Lenehan | 346/139 R |
| 2,603,103 | 7/1952 | Soho | 192/21.5 X |
| 2,622,707 | 12/1952 | Faus | 73/430 X |
| 2,792,565 | 5/1957 | Popowsky | 340/870.42 |
| 3,538,469 | 11/1970 | Litte | 335/219 |

Primary Examiner—Joseph W. Hartary
Attorney, Agent, or Firm—Parmelee, Bollinger & Bramblett

[57] ABSTRACT

Chart recording apparatus for use with industrial instrumentation systems and the like, and comprising memory means to maintain a signal level for long time periods without drift. An input signal level is translated into the positioning of a pen, through the use of an actuator motor controlled by the input signal and a position feedback signal. A friction device is coupled to the pen to hold it in any given position, thereby to serve as a memory for the input signal level. The friction device comprises a thin vane-like element which is secured to the movable member and disposed in the air-gap of a permanent magnet. The air-gap also includes a mass of tiny magnetizable particles which, under the influence of the magnetic field, engage the surfaces of the vane-like element to develop a frictional restraining force. This frictional restraint has the characteristic of being relatively low upon initial movement away from a start point, and thereafter increasing progressively to a plateau level, thereby providing superior dynamic performance particularly in a servo positioning system. A plurality of such controllers can be operated in a time-shared mode, with the memory device of each non-activated recorder holding its pen fixed in position to prevent drift.

5 Claims, 11 Drawing Figures

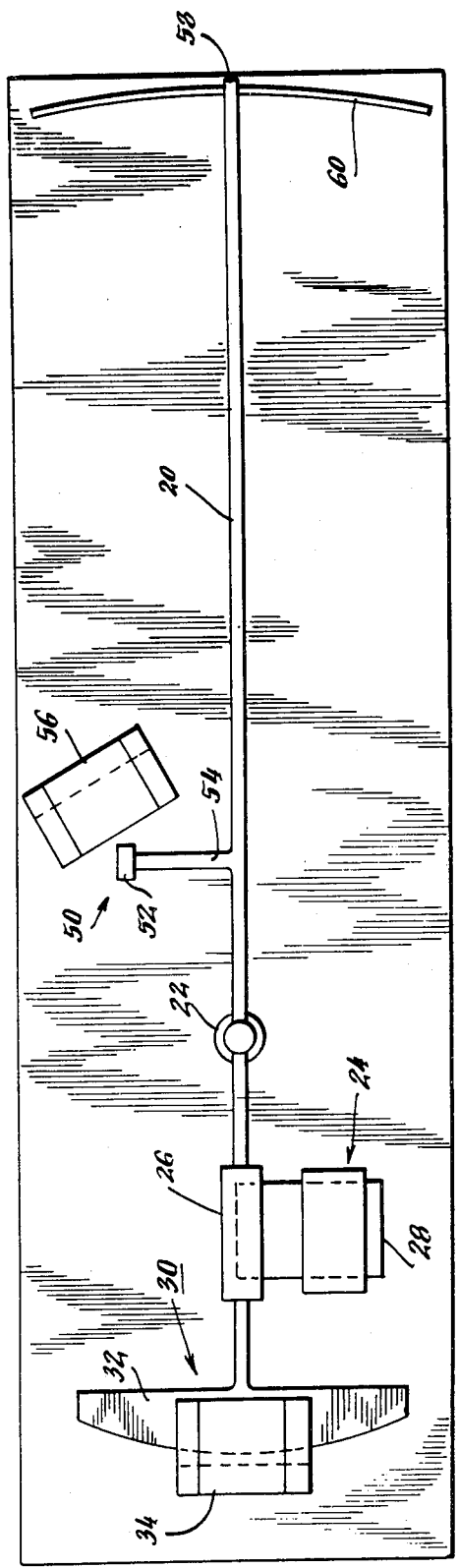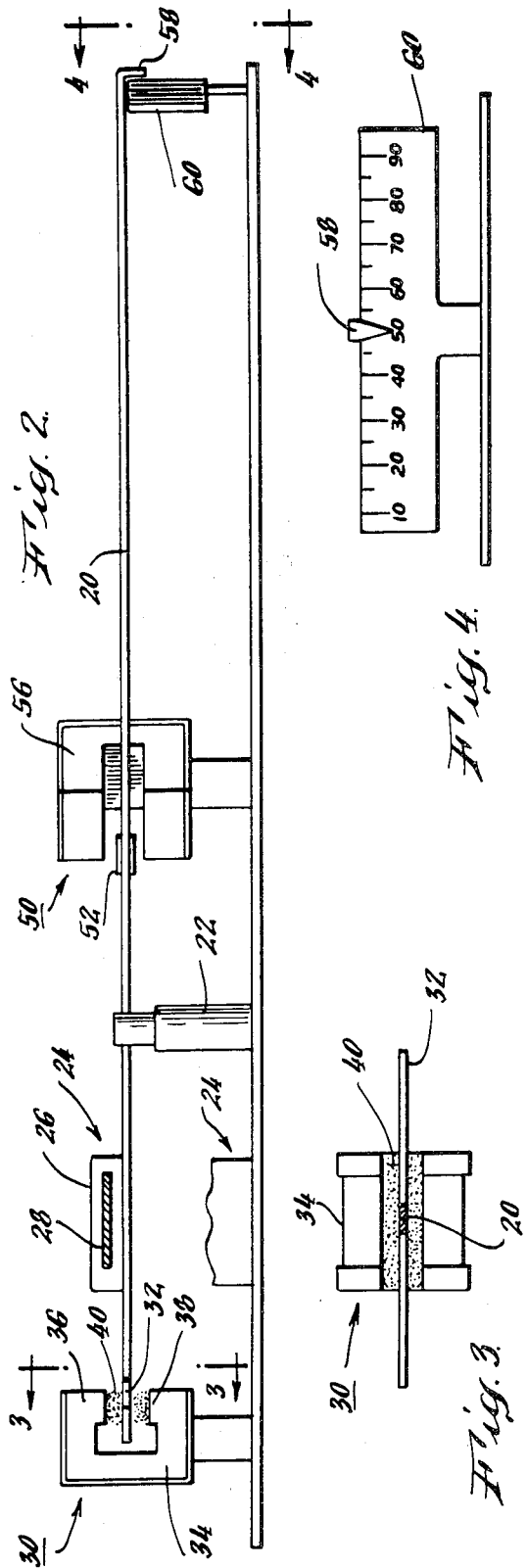

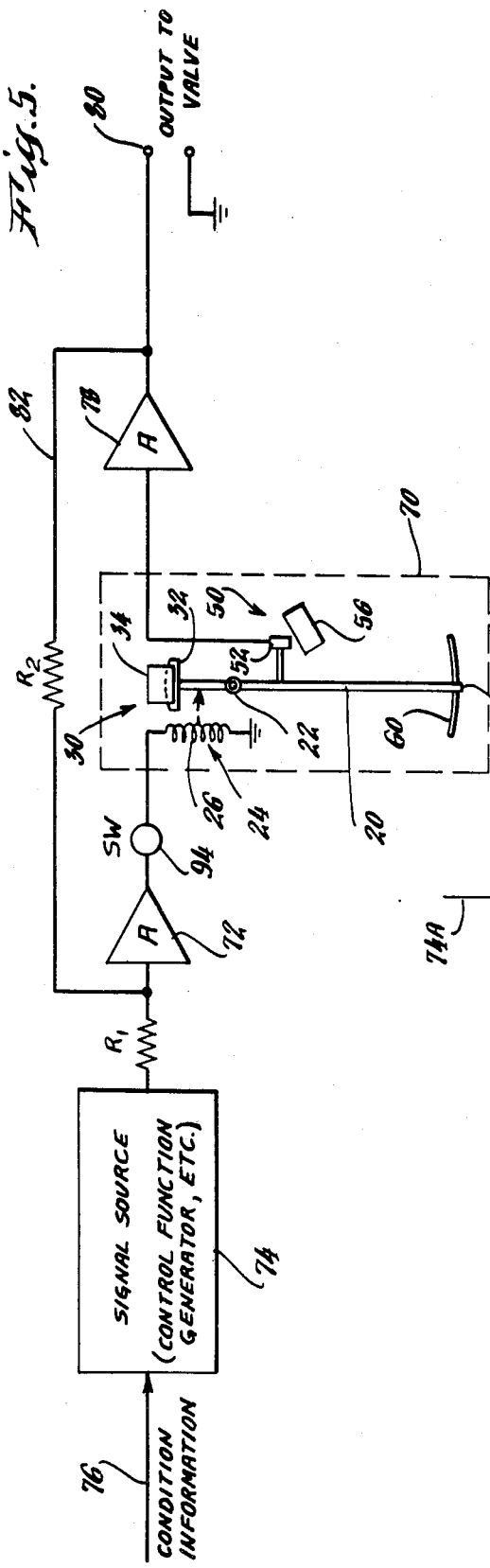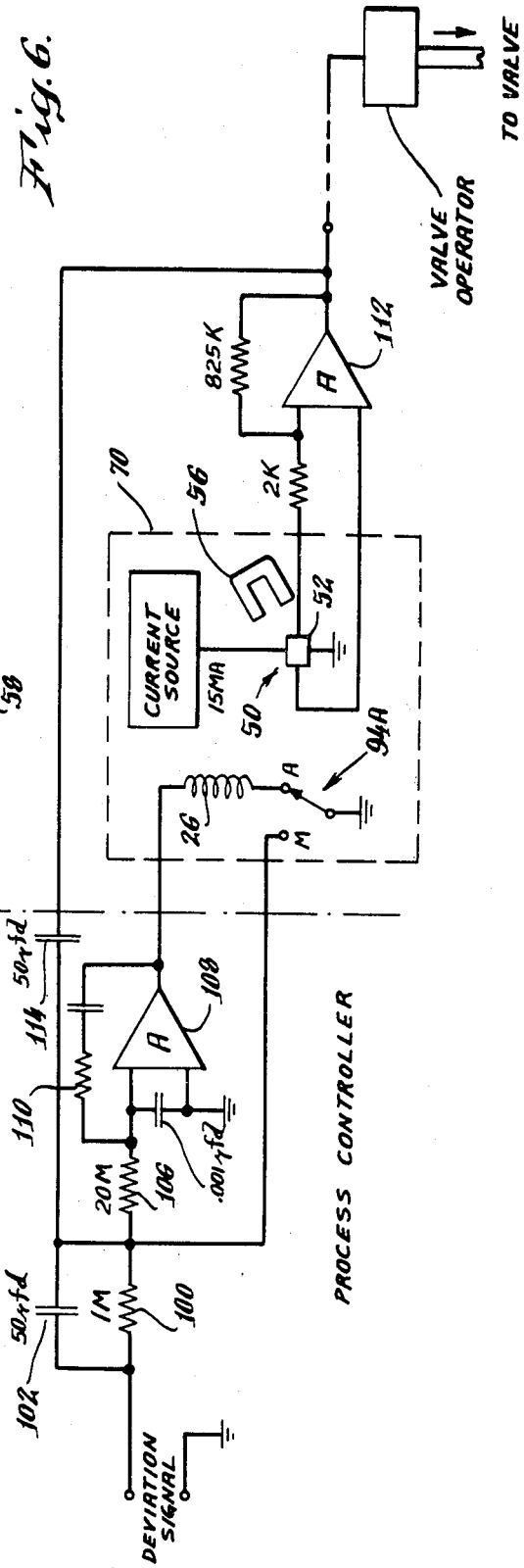

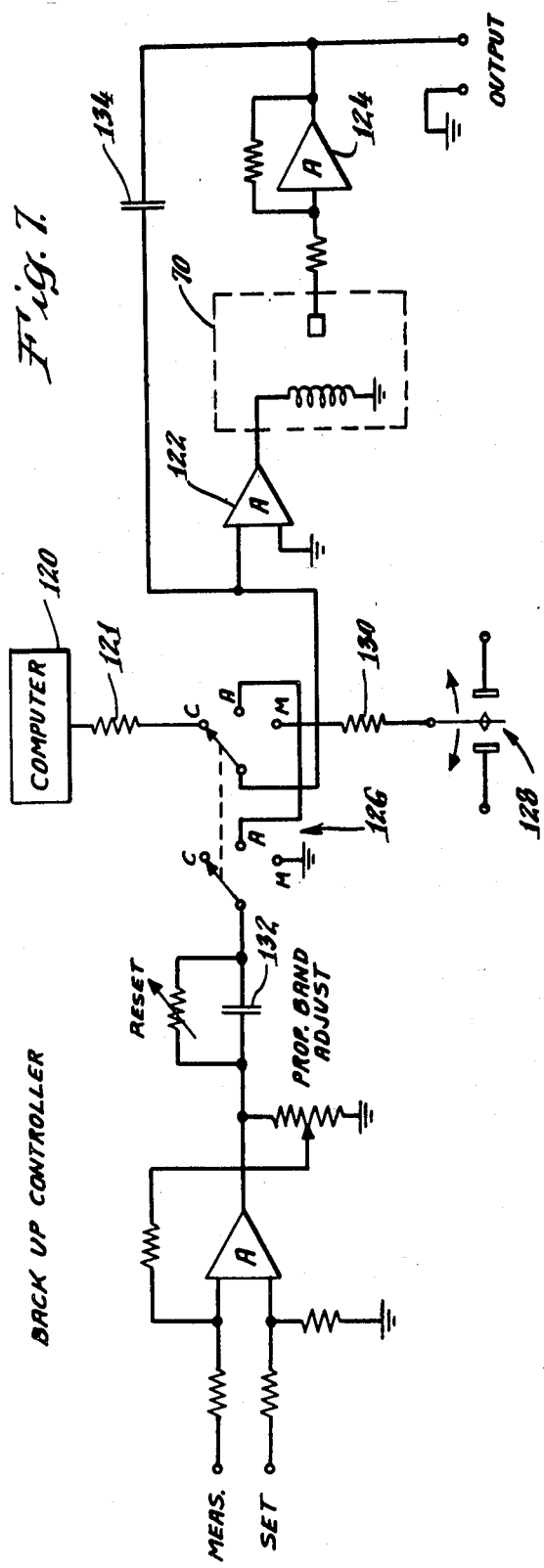
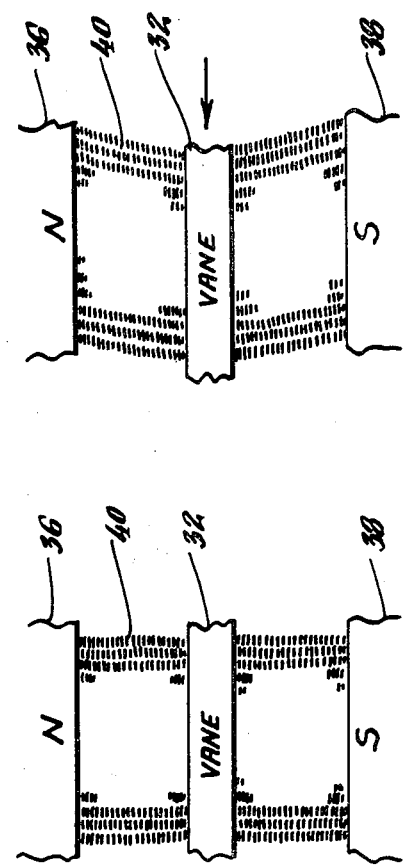
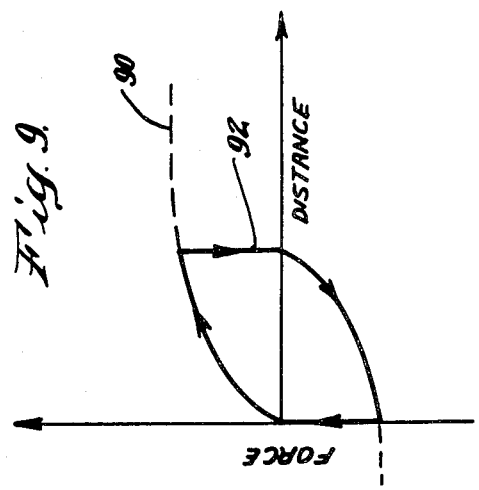

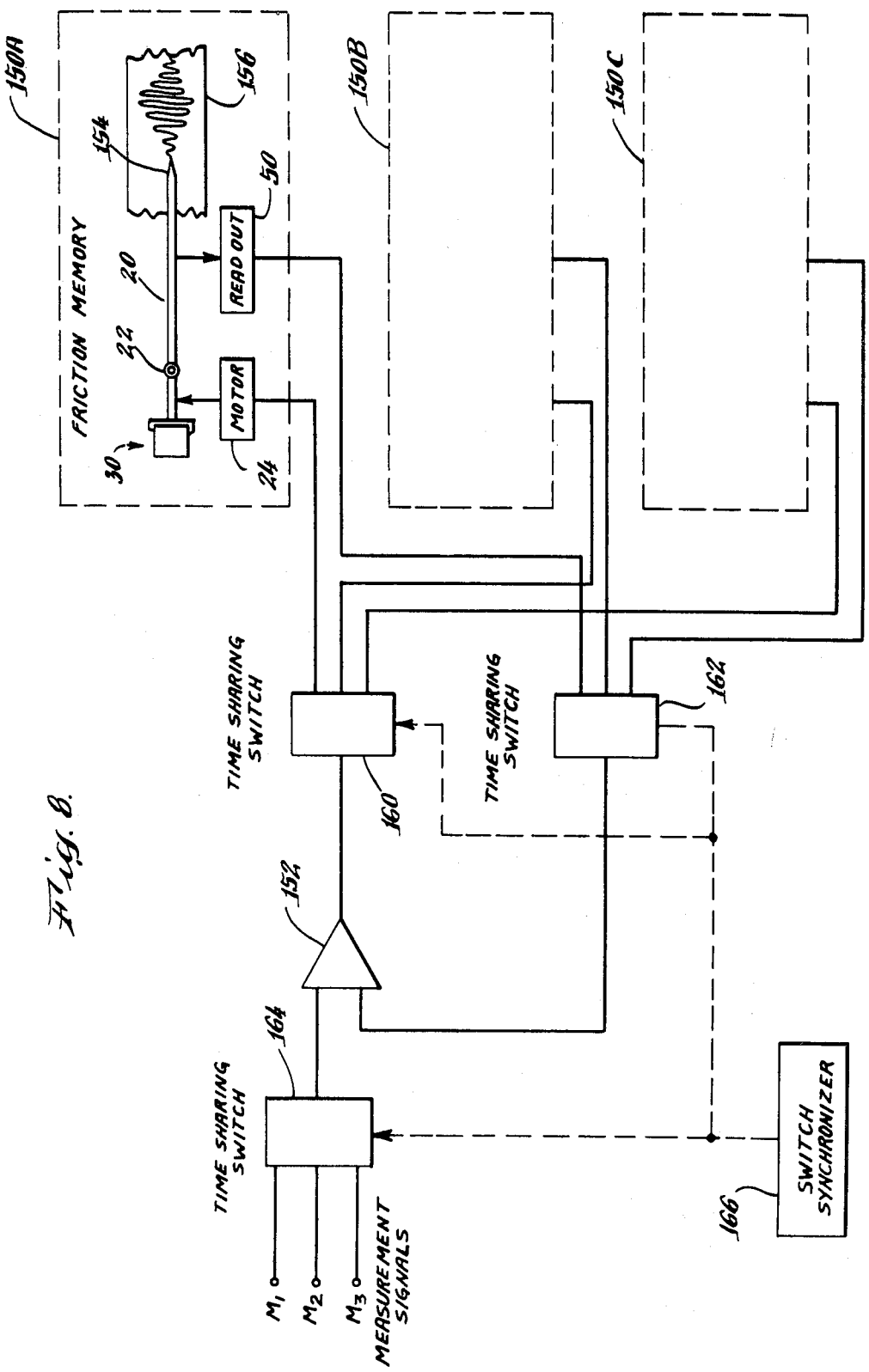

CHART RECORDING APPARATUS

This is a division, of application Ser. No. 923,009 filed July 10, 1978, now U.S. Pat. No. 4,310,841 which in turn is a division of application Ser. No. 641,075 filed Dec. 15, 1975, now U.S. Pat. No. 4,123,696; which is a division of application Ser. No. 543,443 filed Jan. 23, 1975, now abandoned which in turn is a continuation of Ser. No. 333,997 filed Feb. 20, 1973, now abandoned.

BACKGROUND OF THE INVENTION

1. Field of the Invention

This invention relates to signal-handling apparatus used, for example, in developing and transmitting measurement and/or control signals in instrumentation systems for industrial processes. More particularly, this invention relates to apparatus for translating, storing (as by means of a "memory" device), and reading-out signals the magnitudes of which represent information of a numerical or quantitative nature, e.g. the magnitudes or other measurable status of physical conditions such as pressure, temperature, valve position, and the like.

In many instrumentation systems, it is necessary to develop and to process (i.e. to alter in successive steps or stages) signals representing quantitative information such as the magnitudes, intensities, etc., of specific physical conditions. The required processing or handling of such signals typically involves various kinds of signal translations or transformations, wherein the character of the signal is altered to provide certain desired attributes or to permit certain computations or manipulations to be performed. In many cases, it also is necessary to incorporate as an integral element of the signal-handling function the facility to "remember" the magnitude of a signal level for quite long periods of time, e.g. while associated portions of a control system are devoted to different functions on a time shared basis, or, as a more extreme example, when there has been a breakdown in some part of the equipment, an electrical power failure, or other catastrophic event.

The required memory function in such systems generally will have stringent operational and performance specifications, most particularly with respect to the ability to hold a signal level for long periods of time without significant change for any cause, including drift effects which are associated with certain kinds of known memory elements. In addition, signal-handling apparatus of the type referred to herein must have the capability of providing simple, accurate and non-destructive read-out of the stored signal quantity, whereby the signal information (magnitude) is available in a format which is generally useful in (1) any further processing or signal handling, (2) the presentation of the signal information visually, or (3) the transmission of the signal information to remotely-located associated equipment either on a continuous basis or on an "as called for" basis.

2. Description of the Prior Art

As one example of a prior-art signal-processing apparatus having a memory function of the general class herein considered, reference may be made to U.S. Pat. No. 3,550,014 (D. A. Richardson et al). In that patent, there is disclosed an electronic process controller of the analog type wherein a condition measurement signal and a set-point signal are compared to produce a deviation signal which is processed by rate and reset means to develop a D.C. output signal directed to a flow valve or the like, to position the valve in correspondence with the magnitude of the controller output signal. To accommodate and prepare for switch-over of the controller to manual operation, the controller output signal also is directed to a so-called "memory capacitor" (reference number 74 in the above-mentioned patent), to maintain the memory capacitor charged to a level corresponding to the valve control signal.

At switch-over of the controller to manual operation, the memory capacitor referred to above, together with associated signal-producing circuitry, takes over the function of furnishing the valve control signal, maintaining the control signal level at the magnitude it had just before switch-over to manual mode. In practice, the memory capacitor and its associated circuitry are selected to be of high-quality components, capable of holding the capacitor charge with only moderate change over a relatively long period of time. Thus the capacitor can for some time supply a nearly constant, continuous valve signal, substantially equal to the controller valve signal at the moment of switch-over to manual operation.

However, the charge on any such memory capacitor ultimately will dissipate through leakage, even though slowly, so that the valve signal will not remain exactly fixed in magnitude. The result is that the manual signal level must be readjusted from time-to-time, if the controller remains in manual mode for an extended period. Accordingly, there has been a need for a truly satisfactory drift-free memory arrangement to hold the valve signal steady without introducing still other complications or disadvantages. Any alternative memory arrangement particularly should be simple in construction, inexpensive to manufacture, and reliable in performance. Preferably, it should be able to retain the valve signal information even in the face of power failure or other equipment malfunction.

As another example of a prior-art signal-handling apparatus having a memory device, reference may be made to U.S. Pat. Nos. 3,034,718 (M. P. Freitas et al). That patent describes a process control system of the type which includes a centrally-located digital computer for determining the set points of a number of separate analog controllers. This computer produces set-point adjustment signals which are transmitted periodically, in sequence, to set-point stations associated with respective analog controllers. These set-point stations provide set-point signals for the associated controllers.

Each set-point station also serves the function of a memory device, to store the previously-established set-point signal level for use by its associated controller during the times when no signal is received from the computer. The adjustment signals from the computer alter the stored signal level whenever required, and the set point is held at the new adjusted level until the next adjustment signal is received. The set-point signal level also can be adjusted manually, if desired.

The set-point station disclosed in the above-mentioned Feitas et al patent basically comprises a mechanical arrangement wherein a constant-speed, reversible motor is responsive to a pulse-length computer signal, and serves to rotationally position a shaft carrying an output potentiometer. When the motor is not energized by the computer signal, it holds the shaft position fixed, thereby "storing" the set-point signal which is read-out by the potentiometer to the associated analog controller. Thus, the reversible motor serves the dual function of rotating the output potentiometer, thereby altering the set-point signal, and also "remembering" the set-point signal by holding the shaft position fixed between adjustment signals from the computer.

SUMMARY OF THE INVENTION

Signal-processing apparatus in accordance with the present invention will include means responsive to some kind of condition for producing a signal indicative or representative of the magnitude or other measurable aspect of the condition. That is, the condition of interest is definable in terms of quantized, e.g. numerical, information, so that the condition can be represented by a controllable (variable) signal characteristic which may be expressed in various ways, such as in terms of signal amplitude, frequency, or some other form of representational value. The processing of this signal will include, as one stage or phase thereof, the storage of a corresponding signal level in a memory device as will be described herein, and which provides for essentially drift-free maintainence of the signal information for extended or unlimited periods of time.

Processing of the signal subsequent to storage in the drift-free memory device will include the function of converting and/or presenting the signal information in a form adapted expressly for the intended utilization, and thus the nature of such presentation will depend upon the particular application. In some instances, the presentation of the stored information may be arranged as a visual signal suited for mental comprehension, e.g. the positioning of a pointer with respect to a scale. In other instances, the stored information will be transformed to a different signal format adapted for transmission to a remote utilization device. Typically such signal will be in the form of a controllable energy level or other suitable characterization.

It will be evident that in different parts of the signal-handling apparatus, the active signals carrying the information of interest may have quite different forms. Thus they may be electrical in nature, they may be pneumatic, they may be mechanical, they may be a visually-recognizable information signal, or they may be in still other forms. The important factor is that such signals be adapted to convey the desired intelligence relating to the input condition, that they be suited for any required processing, and that they be readily translatable into a form adapted for use with the drift-free memory device to be described.

The memory device forming part of one presently preferred embodiment of this invention comprises a movable member having a non-magnetic blade-like vane element attached thereto and passing through a mass of tiny magnetizable particles in a magnetic field. The particles are thereby magnetized and form a friction-producing, gripping engagement with the non-magnetic vane element, tending to hold that element, and the movable member associated therewith, in a fixed position in the absence of the input driving force. Such driving force may be developed in various ways, such as by an electrically-energizable, solenoid-like motor which applies to the movable member a relatively constant-magnitude but directionally reversible force.

When the driving motor is energized in response to an input signal, the movable member is accelerated against the friction force of the magnetized particles until (if the force is of sufficient duration) the movable member reaches a velocity plateau, moving towards a new desired position. The position of the movable member is continuously sensed or "read out" by means such as a position-to-voltage converter (e.g. a Hall-effect device), arranged to produce a read-out signal the magnitude of which corresponds at all times to the position of the movable member. This voltage signal is, in certain servo-system embodiments to be described, directed to the input of the motor control circuit as a feedback signal, to cause the motor force to drop to zero when the desired position of the movable member has been reached. Such a magnetic-friction memory-arrangement provides significantly improved servo performance, apparently particularly due to the unique friction-force characteristics provided by the magnetized particles, as will be described in detail hereinbelow.

When there is no repositioning force applied by the driving motor, the magnetic-particle friction arrangement serves to hold the movable member firmly fixed in position. That is, the magnetic friction means performs a memory function, locking securely in a drift-free storage the signal information represented by the position of the movable member, as last altered by the signal-controlled driving motor.

The driving motor is controlled by an input electrical current derived from a source arranged to develop a signal responsive to a physical condition such as a pressure, temperature, or the like. This signal source can for example be a computer, or it can be any one of many kinds of components, such as an analog controller developing a valve control signal.

The memory apparatus described herein can be arranged to receive inputs in various formats, e.g. the form of pneumatic signals or electrical signals. The apparatus moreover can be so arranged that it can be operated, in alternative modes, either (1) by a controllable condition-responsive input signal, or (2) manually. For example, in a single unit in accordance with the invention, the input force to the movable member can be derived from an electrically-controlled component, as a motor or the like, or, in a different operating mode of the same apparatus, the movable member can be positioned by hand. In either event, the magnetized particles and associated elements provide the same memory function.

The output from the movable member and associated magnetic friction elements can be developed in a number of different formats. That is, the output can in typical applications be in the form of an electrical signal (voltage or current), in the form of a light signal (e.g. a controllable laser beam), in the form of a pneumatic signal, or in other energy-representational forms. With suitable cooperating elements, the output signal can with advantage in certain applications be derived as a visual read-out signal, as in the positioning of a pointer with respect to a scale, or by controlling the positioning of the pen of a chart recorder.

This magnetic memory means offers a number of significant advantages beyond its drift-free characteristic. Thus, the magnetic-particle friction memory device will not wear, in the sense that ordinary friction devices wear after repeated usage. Also, operation of the magnetic memory is not, as a practical matter, affected by the intrusion of dirt particles, since the memory already consists of many particles physically similar to dirt particles. Moisture, including even oil (at least in small quantities), does not adversely affect the performance of the magnetic memory means to be described. And the construction of the magnetic memory means does not require critical tolerances or adjustments.

Still other objects, aspects and advantages of the invention will in part be pointed out in, and in part apparent from, the following specification considered together with the accompanying drawings.

BRIEF DESCRIPTION OF THE DRAWINGS

FIG. 1 is a plan view showing signal-handling apparatus in accordance with the present invention;

FIG. 2 is a side elevation view of the apparatus of FIG. 1;

FIG. 3 is a detail elevation view taken along line 3—3 of FIG. 2 to show aspects of the magnetic particle friction memory;

FIG. 4 is a detail elevation view taken along line 4—4 of FIG. 2 to show the position read-out means;

FIG. 5 is a schematic block diagram illustrating further elements of the signal-handling apparatus of FIG. 1;

FIG. 6 shows in schematic form details of a flow controller based on the present invention;

FIG. 7 shows schematically a computer-control system with analog controller back-up and manual control facilities all utilizing the present invention;

FIG. 8 is a block-diagram schematic illustrating a time-shared recorder system utilizing the present invention;

FIG. 9 is a graph demonstrating certain force vs. distance characteristics of a magnetic-particle-friction memory device; and FIGS. 10 and 11 are sketches to illustrate how the magnetic particles are aligned and move in operation.

DESCRIPTION OF THE PREFERRED EMBODIMENTS

Referring now to FIGS. 1 and 2, the apparatus shown there comprises an elongate member 20 pivotally mounted at 22, as by means of suitable flexures, for rotary motion in a horizontal plane. Such motion is imparted by an actuator which may take any of various forms, and is illustrated herein as an electrically-energized, moving-coil driving motor 24. The coil 26 of this motor is mounted on the member 20 and surrounds a permanent magnet 28 fixed in position on the instrument base. Current flow through the motor coil develops a corresponding force proportional to current magnitude, tending to rotate member 20 about its pivot axis in a direction which depends upon the direction (polarity) of current flow.

As discussed hereinabove, the positioning of the member 20 is in effect a signal representing a quantized magnitude or other item of information respecting some physical condition such as temperature or the like. To insure retention of this information under a variety of operating conditions, the pivoted member 20 is coupled at its left-hand end to a memory device, generally indicated at 30. This device, although permitting member 20 to be moved by motor 24, serves to hold member 20 firmly in any given position to which it has been directed by that motor, or by any other source of input motion of appropriate strength. This holding action is produced by a frictional restraint which develops sufficient restrictive force to maintain the movable member 20 securely in any position, in the absence of a driving force from the motor or other input source of comparable strength.

The memory device 30 comprises, in this embodiment, a relatively thin blade-like vane element 32 of non-magnetic material (e.g. brass, stainless steel, etc.) which is secured to the member 20 for movement therewith. Referring also to FIG. 3, this vane element 32 is disposed horizontally within the air-gap of a permanent magnet 34, parallel to the opposed pole-pieces 36, 38 of the magnet.

Also disposed within the air-gap of the magnet 34, and thus subject to the approximately vertical magnetic field produced thereby, is a mass of tiny particles 40 of a magnetizable substance, substantially filling the air-gap spaces above and below the vane element 32. These particles may for example be of ferrite material having relatively small retentivity, and thus relatively small hysteresis. Very successful results have been achieved with commercially available iron-oxide particles of the type used for making ferrite magnetic cores. One batch of particles used for test purposes was specified as 60 mesh; examination of the particles indicated that they were non-uniform in shape and size, some particles differing perhaps as much as 50:1 in size. However, it is not presently considered that such non-uniformity is essential in carrying out the present invention.

The particles 40 are magnetized by the field produced by the permanent magnet 34 and, under the influence of that field, they engage the adjacent surfaces of the vane element 32 with a frictional contact, thereby to develop a restraining force opposing (but not preventing) any motion of the movable member 20. The amount of frictional restraining force is to some degree proportional to the intensity of the magnetic field which could, of course, be provided by an electro-magnet and thereby controllably altered to achieve any special effects for particular applications. In any event, within a very wide range of magnetic field strengths, the friction force developed by the particles 40 serves positively to prevent any drift movement of member 20, while permitting desired movement responsive to an input force from the driving motor. Thus, the magnetic-particle friction device serves continuously as a "memory" to retain securely any signal magnitude or other information represented by the positioning of member 20 acting under the impetus of the driving motor.

The information represented by the positioning of member 20 is read out by means operable to produce a signal having a controllable characteristic identifying that information. In the FIG. 1 embodiment, such read-out is effected in the first instance by a position-to-voltage sensor 50 which can be any of various known devices but is illustratively shown as a so-called Hall-effect generator. Such an arrangement comprises a crystal 52 of semi-conductor material mounted on an arm 54 integral with the movable member 20. As this member rotates about its pivot axis 22, the crystal 52 moves towards (or away from) the air-gap of a permanent magnet 56, to subject the crystal to a magnetic field intensity which varies as a function of the positioning of member 20.

With a constant current flowing through the Hall-effect crystal 52 (from conventional means, not shown in FIGS. 1 and 2), the application of such magnetic field from magnet 56 results in development of an output voltage at the crystal output terminals. The magnitude of this voltage at all times is proportional to the magnetic field intensity. Thus the voltage magnitude at the sensor output corresponds at all times to the position of the member 20.

The apparatus of FIGS. 1 and 2 includes an additional read-out means in the form of a pointer 58 on the right-hand end of the pivoted member 20 (see also FIG. 4). This pointer is positioned for horizontal movement in front of a conventional scale 60 illustratively arranged in this case to indicate valve positions between 0% and 100%. Thus the pointer-and-scale combination provide a direct visual read-out of the position of member 20, to indicate to an observer the magnitude of the corresponding signal information.

The pointer 58 also can serve as a manually-controllable actuator means for the member 20. Thus an operator can grasp the extended pointer portion of member 20 and move that member manually to any desired position. Wherever the pointer is so positioned manually, the magnetic memory means 30 will, with its continuous friction restraint, serve to hold member 20 securely in place, pending receipt of a further actuator force from the motor 24, or manually. It may further be noted that the member 20 can be provided with any other desired mechanical means specially designed to facilitate manual grasping of member 20 to effect any appropriate movement of member 20. In any event, regardless of whether the member 20 is moved by an electrical actuator, a pressure (e.g. pneumatic) actuator, a manual actuator, or any other form of actuator, the sensor 50 will at all times produce an electrical output signal corresponding to the actual positioning of the movable member.

The voltage read-out signal from sensor 50 can be employed to perform any of a variety of functions. One important function in many applications of the invention is to provide a position feedback signal for use in servo control of the member 20. Such an arrangement is illustrated schematically in FIG. 5.

Referring first to the central portion of FIG. 5, there is shown within a dashed-line block 70 the basic elements previously described with reference to FIGS. 1 and 2. As shown in FIG. 5, the actuator motor 24 receives its control current from an amplifier 72 the principal input to which is derived through a resistor $R_1$ connected to a signal source generally indicated at 74. This signal source can be any of many different kinds of equipment, such as a computer or an analog process controller, and as illustrated at 76 receives incoming data or signal information respecting the magnitude or other characteristic of a physical condition concerning which computations or other signal processing must be performed.

The position of member 20 is at all times tracked by the sensor 50, and the output signal of this sensor is directed to the input of an amplifier 78 to increase the signal energy level. The output of this amplifier is shown connected to an output terminal 80 for subsequent transmission to associated equipment for further processing or utilization. The amplifier output signal also is directed through a conductive negative feedback circuit 82 (including resistor $R_2$) to the input of amplifier 72, so as to oppose and counter the input signal produced by the signal source 74.

When the movable member 20 has been driven to a position producing a feedback signal from amplifier 78 equal to the input signal from source 74, the amplifier 72 will no longer send current through motor coil 26, and the member 20 ultimately will come to rest in that commanded position. The memory device 30 will thereafter automatically hold the member 20 securely in that position, preventing any drift or alteration of the information so represented. That information is, in turn, represented by the output signal from amplifier 78 and by the visual display of pointer 58 with respect to scale 60.

An important attribute of the memory device 30, especially in a servo system application such as shown in FIG. 5, is its unusual force vs. motion characteristic. Of particular importance is that motion of member 20 can be initiated by a relatively low force, substantially less than that required to move the member large distances. To demonstrate this aspect, FIG. 9 has been included to present a graph illustrating the relationship between force and movement of the vane 32, as it moves away from, and returns to, an arbitrary "neutral" starting point. Specifically, this graph shows displacement of the vane plotted against the friction to force opposing such movement (i.e. the force which is overcome by the motor 24, or manually, to produce the observed movement).

As appears from this FIG. 9 graph, the amount of force required to initiate movement is quite low, while the amount of force required to sustain movement progressively increases as the vane moves away from its starting or neutral position. Ultimately, as shown by the curve extension 90, the required force reaches a plateau where an applied force of that magnitude will maintain continuous motion. Any further increase in force will accelerate the vane until some other limiting condition is reached. If the force is reduced to zero, as at 92, the vane will stop. Movement in the reverse direction can be initiated by a relatively low force, while progressively higher friction force will be encountered as the vane moves still further in the reverse direction.

This characteristic is particularly well suited for servo applications because it tends to minimize hunting or other oscillations, and makes it more readily possible to have a dead-beat (e.g. critically damped) positioning movement without any significant overshoot. In ordinary servo systems, wherein conventional friction characteristics are present, the initial resisting friction force will be quite high (relative to the friction encountered at sustained velocities). Thus the servo motor must build up a high initial force to overcome the starting friction. Subsequently, as the conventional friction force decreases with increasing velocity, the driven element tends to accelerate unduly, making de-hunting and stabilization difficult. These problems are largely minimized or avoided by the magnetic-particle friction characteristics shown in FIG. 9.

It should be understood that the graph of FIG. 9 has been provided to help explain certain observed advantages of the magnetic-particle friction memory device 30, and that it presents a somewhat idealized version of the characteristics of that device. Thus, the graph has been drawn to indicate a symmetry of response to movement in either direction which may not be entirely realizable in practice. Similarly, the hysteresis-like characteristics may not be exactly duplicated in repeated cycles of the memory device 30.

In any event, there is some uncertainty at present regarding the precise theoretical explanation for the characteristic behavior of the magnetic memory 30 as illustrated in FIG. 9. However, it would appear that at least part of the explanation may be that the tiny magnetic particles tend, when in a magnetic field, to become aligned in chain-like strings as indicated in FIG. 10. Evidently, such strings have a degree of longitudinal extensibility so that, as suggested in FIG. 11, initial movement of the vane 32 will be accompanied primarily be a lengthwise extension of the strings, thus producing a relatively low opposition force against that initial movement. Thereafter, as more of the strings progressively reach the limit of their longitudinal extensibility, the magnetic particles engaged with the vane begin to slide over the vane surface causing the more normal frictional characteristic which might be expected from a mass of particles.

As noted hereinabove, the force produced by the driving motor 24 is proportional to the current flowing through coil 26. However, the gain of the amplifier 72 may typically be quite high, so that the motor current will reach a limiting (maximum) value with a relatively small amplifier input signal. Put in terms sometimes used in describing servo systems, the "V" notch of the motor operating characteristic ordinarily will be very narrow, perhaps as small as 1/10% of full-scale. Thus, if the signal source 74 in such an arrangement commands a change in position greater than 1/10% of full-scale movement, the motor current will quickly reach its maximum level. Since many changes in position could be expected to be larger than 1/10%, the driving motor will under such conditions appear to be essentially an on-off constant-force device.

The magnetic memory 30 also has a characteristic "V" notch, in that the friction force is minimum at the start position, and progressively increases for movement in either direction away from that start position. Apparently, the width of the "V" depends at least to some extent on the nature of the magnetic particles, particularly their size, and perhaps other aspects thereof. In one embodiment, the half-width of the "V", i.e. the distance the vane moved from its start point to reach the maximum friction plateau, was about 0.01" to 0.02". In that particular embodiment, such vane movement constituted about 2% to 4% of full-scale movement, substantially larger than the "V" of the driving motor characteristic. However, since the amount of movement required to go from minimum to maximum friction is in reality an absolute distance, the percentage of full-scale movement represented by that distance can be altered by changing the total travel of the vane required for full-scale output change.

When the "V" of the motor characteristic is significantly smaller thant the "V" of the magnetic memory, the motor force will reach its maximum value well before the friction restraint reaches its maximum value. To prevent excessive speed of the movable member 20 for large changes in position, the maximum frictional force should be proportioned in some reasonable fashion with regard to the maximum motor force. For example, the maximum friction force may be set at about one-half the maximum motor force, thus providing some margin of additional motor force, e.g. to assure adequate acceleration, to overcome other frictions which will be present in any practical installation, and to aid in overcoming the possible effects of time lags such as due to the inductive reactance of the motor coil 26. It may also be noted that the back e.m.f. of the motor coil, due to motion of the coil in the permanent magnet field, tends to reduce the coil current in a dynamic state. This effect tends to reduce the maximum available motor force at higher velocities and can provide some degree of self regulation of the vane movement.

The system of FIG. 5 can be used as a process controller, to produce at output terminal 80 a valve control signal corresponding to a control signal developed by a conventional control-function-generator serving as the signal source 74. Such control-function-generator may for example be like that shown in the above-mentioned U.S. Pat. No. 3,550,014, producing an output signal responsive to a measurement input signal, and, when appropriate, incorporating into the output signal suitable reset and rate components for the particular process application. The apparatus 70 translates such signal into a directly corresponding position information signal (i.e. the position of member 20), and the sensor 50 and the pointer 58 provide read-out signals representative of that position information signal. The read-out signal from amplifier 78 can be directed to a remotely-located valve operator or the like to position a process valve in accordance with the output signal magnitude. The pointer 58 can serve the function of indicating the position of the valve, thereby dispensing with the usual valve position meter typically associated with a process controller which is remote from the valve.

In a process control application of the FIG. 5 system as described hereinabove, the magnetic-particle memory 30 serves at all times to store a signal representing the valve control signal. Thus, in the event of failure of power for the control-function-generator 74, the valve position information is held securely in a non-destructable type of memory, for continuously generating a suitable valve control signal, or for reconstituting such valve control signal after power has been restored.

The system can be placed in manual operation by opening a switch 94 between the control-function-generator 74 and the input to amplifier 72, and thereafter controlling the valve signal by manually shifting the pointer 58 to any desired valve opening. In such manual mode, the operator in effect grasps the process valve stem when he grasps the pointer 58, because movement of the pointer automatically causes a corresponding movement of the valve stem.

FIG. 6 shows a process controller arrangement wherein the feedback means around the memory apparatus 70 is non-conductive (specifically capacitive), and plays a part in determining the dynamics of the control function. The particular controller design shown can be used for various control applications, such as flow control, and thus incorporates means to produce both proportioning and reset action in the valve control signal.

The deviation signal (i.e. a signal proportional to the difference between a measurement signal and a setpoint signal) is directed first through an RC network consisting of a large resistor 100 (adjustable if desired) in parallel with a capacitor 102, and then through a relatively small input resistor 106 to an amplifier 108. This amplifier includes a stabilizing feedback circuit 110, and a small capacitor connected between its input terminals. The output of amplifier 108 controls the current flow through an actuator motor coil 26 as before, to apply a force to a movable member (not shown in FIG. 6, but comparable to member 20 in FIG. 1). Associated with that movable member is a magnetic particle memory as at 30 in FIG. 1. Position sensor 50 is responsive to the positioning of the movable member, and produces a signal which is directed to an amplifier 112 to develop a valve control signal and a corresponding feedback signal.

In the FIG. 6 controller, the feedback signal from amplifier 112 is coupled through a capacitor 114 to the junction between resistors 100 and 106. (This junction is in effect the input of amplifier 108, because the input resistor 106 is of quite small size relative to resistor 100.) In operation, when there is a change in the deviation signal at the controller input, e.g. a step upset, this change in voltage initially will appear across input capacitor 102, and a corresponding opposite-polarity voltage will appear across feedback capacitor 114, i.e. at the output of the controller. The magnitude of the output voltage change will be determined by the relative capacities of capacitors 102 and 114. If they are equal, the controller output signal change will be equal to the deviation signal change. (Note: This initial output signal change represents the "proportioning step" response to a sudden change in measurement value.)

After the initial response described above, the feedback capacitor 114 will charge up at a rate determined by the RC combination of resistor 100 and capacitor 114. The feedback circuit around apparatus 70 serves in effect as an integrator, providing reset action in the controller output to insure that the valve control signal ultimately reaches a proper magnitude to restore the measurement value substantially to the desired set point level. Accordingly, it will be seen that apparatus in accordance with the present invention is well suited for use in process control systems.

The FIG. 6 system also includes means for transfer between automatic and manual operation in a bumpless, balanceless fashion. By placing switch 94A in manual position, the input of amplifier 108 is effectively grounded, and the motor coil 26 is de-energized. Thereafter, the movable member 20 (as shown in FIG. 5) can be shifted manually to control the output signal to the valve. If desired, the principal control-function-generator components (e.g. those to the left of line 74A) can physically be removed to permit any repairs or adjustments which might be necessary, all without disturbing in any way the continued operation of the output signal portions of the equipment including the memory means 30 and the member 20. The controller can thereafter be placed back into operative condition and switched into active control of the driving motor 24 without "bumping" the process or requiring any balancing adjustment prior to switchback to automatic operation.

FIG. 7 shows the generic memory apparatus 70 used in a process control system wherein the primary control signal is derived from a computer 120, e.g. in the form of pulse-type signal, such as those wherein the pulse duration represents the amount by which the process valve is to be shifted, and the pulse polarity indicates the direction of valve movement. The computer signals are directed to an input amplifier 122 to control the operation of the movable member (e.g. member 20) the position of which is maintained securely, between commanded position changes, by means of a magnetic particle memory 30. The position of the movable member is continuously sensed to produce an output valve control signal from an output amplifier 124.

A three-way switch 126 is provided to permit the system to be switched from computer control to back-up analog control, or to manual control. In the latter position, a manually-operable two-position switch 128 can be momentarily actuated to send current, of either polarity, through a large resistor 130 to the input amplifier 122, to vary the position of the movable member of apparatus 70, and to alter the valve control signal correspondingly. Once the valve signal has been set to the desired level, the memory apparatus 70 will maintain it securely at that level, i.e. acting as a so-called "hard" manual. When switch 126 is placed in back-up position, an analog controller is formed in an arrangement similar to that described with reference to FIG. 6. Since this controller normally would be used only in emergency conditions, when precision control is not likely to be essential, the various controller components need not be of the most costly, highest quality types. For example, the capacitors 132 and 134 could be ordinary electrolytic capacitors.

FIG. 8 illustrates how the memory apparatus of the present invention can be applied to a chart recorder of the type wherein a pen produces permanent markings on a moving record. The system of FIG. 8 comprises a plurality of strip-chart recorder units 150A, 150B, 150C, each with its own memory apparatus, and all serviced on a time-shared basis by common operating equipment symbolized by an amplifier 152.

Each recorder unit 150 includes a pivoted member 20 carrying a pen 154 to produce traces on the moving chart record 156. The member 20, as previously described, is actuated by a driving motor 24, and its position is continuously tracked by a sensor 50 to produce a read-out signal indicating the pen position. The movable member 20 also is coupled to a memory device 30, utilizing the friction characteristics of tiny magnetized particles as previously described.

The time-sharing system may be any of many types used heretofore, and one form of system is shown in FIG. 8 simply to illustrate the concept. In this system, three multiplexing switches 160, 162, 164 (performing a commutator-like function) are controlled in unison by a switch synchronizer 166 to: (1) connect each of the recorder units 150, in succession, to the common operating equipment so as to supply a motor control signal to the selected recording unit and to supply a pen position feedback signal from the selected unit to one input of amplifier 152, and (2) connect the other input of amplifier 152 to a measurement signal corresponding to the selected recorder unit.

Thus, each recorder unit periodically is activated by a corresponding measurement signal to position its pen in accordance with the signal level. The position feedback signal is derived through a conductive feedback circuit, as in FIG. 5 herein, so that the pen will always be driven to a position corresponding directly to the applied measurement signal. During times intervening such activation of the recorder units, the associated memory devices 30 hold the pens securely in position previously set, so as to continue proper read-out and recording of the measurement data. During those times when any recorder pen is being shifted to a new position, the friction characteristics of the magnetic material provides superior servo response, as described in more detail hereinabove, to assure accurate positioning within the shortened action time available in a time-sharing system.

It will be evident from the above description of several embodiments of the invention that an important element of the invention is the use of small magnetizable particles to provide friction effects creating a unique memory for signal levels representing the magnitudes of physical conditions and the like. The availability of small magnetizable particles has of course been well known for a long time prior to the present invention. For example, U.S. Pat. No. 2,500,953 shows magnetic particles used in a so-called magneto-resistor. U.S. Pat. No. 2,575,360 shows magnetic particles used in a torque and force transmitting device (i.e. a magnetic clutch). U.S. Pat. No. 2,667,237 shows magnetic particles used in a magnetic fluid shock absorber and related devices. U.S. Pat. No. 2,629,552 shows a magnetic fluid clutch employed in a control system. U.S. Pat. No. 2,603,103 shows a variable inertia device using magnetizable particles. U.S. Pat. No. 2,792,565 shows fluidized magnetic particles solidified by magnetism to prevent any movement of a mechanism; this patent also shows a variable resistance unit including magnetizable carbonyl iron suspended in oil. U.S. Pat. No. 2,996,267 shows a vibration dampening mechanism including a variable-viscosity dashpot having fluidized magnetic particles. None of these patents discloses the present invention.

Although several specific embodiments of the present invention have been described hereinabove in considerable detail, it is desired to emphasize that such descriptive material has been presented for the purpose of teaching the concepts and advantages of the invention, and should not be treated as necessarily limiting of the invention since it is clear that many variants and modifications of the invention can be devised by those skilled in the art to meet the requirements of quite different applications.

I claim:

1. Recorder apparatus comprising:
    movably-mounted marking means for producing a mark on a chart record;
    actuator means responsive to an input signal and operable to apply a force to said marking means to move it towards a new position;
    feedback means for producing a feedback signal proportional to the position of said marking means and for directing said feedback signal to said actuator means to oppose said input signal, so that the marking means is driven to a position corresponding to said input signal; and
    friction means restraining movement of said marking means, said friction means comprising a mass of small magnetized particles engaging the surface of a part movable with said marking means, to produce a friction restraint which is relatively small at initial movement of said marking means away from a start point and which thereafter grows in magnitude as the movement continues, said friction means serving to maintain said marking means securely in position during periods intervening activation of said actuator means.

2. Apparatus as claimed in claim 1, wherein said marking means comprises a pen mounted on the end of a pivotally-mounted member; and
    means to move a chart record beneath said pen to receive tracings therefrom.

3. Apparatus as claimed in claim 1, wherein said particles comprise iron-oxide powder located in a magnetic field.

4. Apparatus as claimed in claim 3, including a permanent magnet to develop said magnetic field;
    said particles being located between the pole-pieces of said permanent magnet and substantially filling the air-gap space therebetween.

5. Apparatus as claimed in claim 1, comprising a plurality of units of said recorder apparatus each for recording a corresponding input signal; and
    time-share switch means for distributing a plurality of input signals to said recorder units respectively and in succession while simultaneously switching the corresponding position feedback signal into opposition to the distributed input signal, whereby to successively activate each of said recorder units to bring its marker means into position according to the input signal therefor, the marking means of the non-active recorder units being held securely in position by its associated friction means pending receipt of the next input signal information.

* * * * *